(12) United States Patent
Turnaus

(10) Patent No.: US 8,782,594 B2
(45) Date of Patent: Jul. 15, 2014

(54) METHOD FOR STRUCTURING A FUNCTION PLAN INTO FUNCTION PLAN SECTIONS

(75) Inventor: Andre Turnaus, Heroldsberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 13/809,520

(22) PCT Filed: May 24, 2011

(86) PCT No.: PCT/EP2011/058451
§ 371 (c)(1),
(2), (4) Date: Jan. 10, 2013

(87) PCT Pub. No.: WO2012/007215
PCT Pub. Date: Jan. 19, 2012

(65) Prior Publication Data
US 2013/0117724 A1    May 9, 2013

(30) Foreign Application Priority Data

Jul. 14, 2010   (EP) .................................... 10169526

(51) Int. Cl.
*G06F 17/50* (2006.01)
*G06F 15/04* (2006.01)
(52) U.S. Cl.
USPC .......................................... 716/139; 716/100

(58) Field of Classification Search
CPC ............ G06F 17/5045; G06F 17/5036; G06F 17/505; G06F 17/5068; G06F 17/5054; G06F 17/5072; G06F 17/5077
USPC .................................................. 716/100, 139
See application file for complete search history.

(56) References Cited

U.S. PATENT DOCUMENTS

| | | | |
|---|---|---|---|
| 6,931,288 | B1 | 8/2005 | Lee et al. |
| 2006/0206866 | A1 | 9/2006 | Eldrige et al. |
| 2009/0216343 | A1* | 8/2009 | Drebinger ....................... 700/19 |

* cited by examiner

*Primary Examiner* — Jack Chiang
*Assistant Examiner* — Magid Dimyan
(74) *Attorney, Agent, or Firm* — Harness, Dickey & Pierce, P.L.C.

(57) ABSTRACT

A method is disclosed for structuring a function plan into function plan sections. The function plan includes function modules. Individual function modules are connected to at least one other function module of at least one function module connection. If the function plan exceeds the predefined area of the function plan section, a first determination of the arising function module external connections in an assignment of the individual function modules to the individual function plan sections occurs for each function plan variant, and the individual function modules are assigned to the function plan sections according to the function plan variant having the least possible number of function module external connections.

20 Claims, 6 Drawing Sheets

METHOD FOR STRUCTURING A FUNCTION PLAN INTO FUNCTION PLAN SECTIONS

PRIORITY STATEMENT

This application is the national phase under 35 U.S.C. §371 of PCT International Application No. PCT/EP2011/058451 which has an International filing date of May 24, 2011, which designated the United States of America, and which claims priority to European patent application number EP 10169526.0 filed Jul. 14, 2010, the entire contents of each of which are hereby incorporated herein by reference.

FIELD

At least one embodiment of the invention generally relates to a method.

BACKGROUND

Low-voltage switching devices (e.g. motor starters, motor management systems or security systems) are increasingly characterized by a multiplicity of device parameters and device functions. Complex switching devices are increasingly capable of processing application logic (e.g. security programs), and can therefore be adapted flexibly to demands in the field.

The parameterization of these complex electronic switching devices normally takes place using an engineering system which provides both the logic and the parameters for the device. Modern engineering systems also have a graphical user interface (GUI) which makes it easy for the designer to parameterize the corresponding devices.

One aspect of the graphical user interface of the engineering system is that the functions offered by the device can be selected from a function catalog and circuit wired in a function plan by the designer. Within such a function plan, the designer can circuit wire function modules to each other and thereby produce a function logic that is entirely tailored to the specific application. FIG. 1 provides a simplified illustration of a graphical user interface of such an engineering system.

As the complexity of the switching devices increases, so does the number of function modules that have to be circuit wired in a function plan. Consequently, the plans become larger and extend over many pages. The number of connections (function module connections) between the function modules also increases.

One of the core functions of an engineering system is the documentation of such circuit wiring plans. The difficulty lies in extracting (printing out) complex and extensive circuit wiring plans (function plans) in such a way that they remain easy to read and interpret. Only then can the generated documentation be used not only for archiving purposes but also when optimizing the circuit wiring or when fault finding.

The readability of a function plan usually serves as a guide when producing the documentation, since the function plan is divided into n equal parts and each part is assigned to a function plan section (e.g. a printed page). When a printout is made, the paper size and the paper format can be adjusted by means of general options, for example. The page boundaries would have been displayed in the plan view in the engineering system, and therefore the designer could have taken this into consideration and positioned the function elements accordingly when producing the plan. Division of a circuit wiring plan into six printed pages is shown in FIG. 2, for example.

SUMMARY

At least one embodiment of the present invention is therefore directed to allowing a function plan to be structured into function plan sections in an optimal manner. According to at least one embodiment of the invention, a complex and extensive function plan (circuit wiring plan) is preferably so structured into individual function plan sections that the individual function plan sections remain easy to read and interpret.

A method is disclosed for structuring a function plan into function plan sections, wherein the function plan comprises function modules and individual function modules are connected to at least one other function module via at least one function module connection, wherein the respective function plan section forms a predefined area for representing at least one part of the function plan, wherein the function module connection between two function modules of different function sections of the function plan is a function module external connection, wherein if the function plan exceeds the predefined area of the function plan section, a first determination of the arising function module external connections in an assignment of the individual function modules to the individual function plan sections occurs for each function plan variant, and the individual function modules are assigned to the function plan sections according to the function plan variant having the smallest possible number of function module external connections, and/or a computer program product and/or an engineering system.

Advantageous developments of the invention are specified in the dependent claims.

BRIEF DESCRIPTION OF THE DRAWINGS

The invention and embodiments of the invention are described and explained in greater detail below with reference to the example embodiments illustrated in the figures, in which.

DETAILED DESCRIPTION OF THE EXAMPLE EMBODIMENTS

Figure 1:
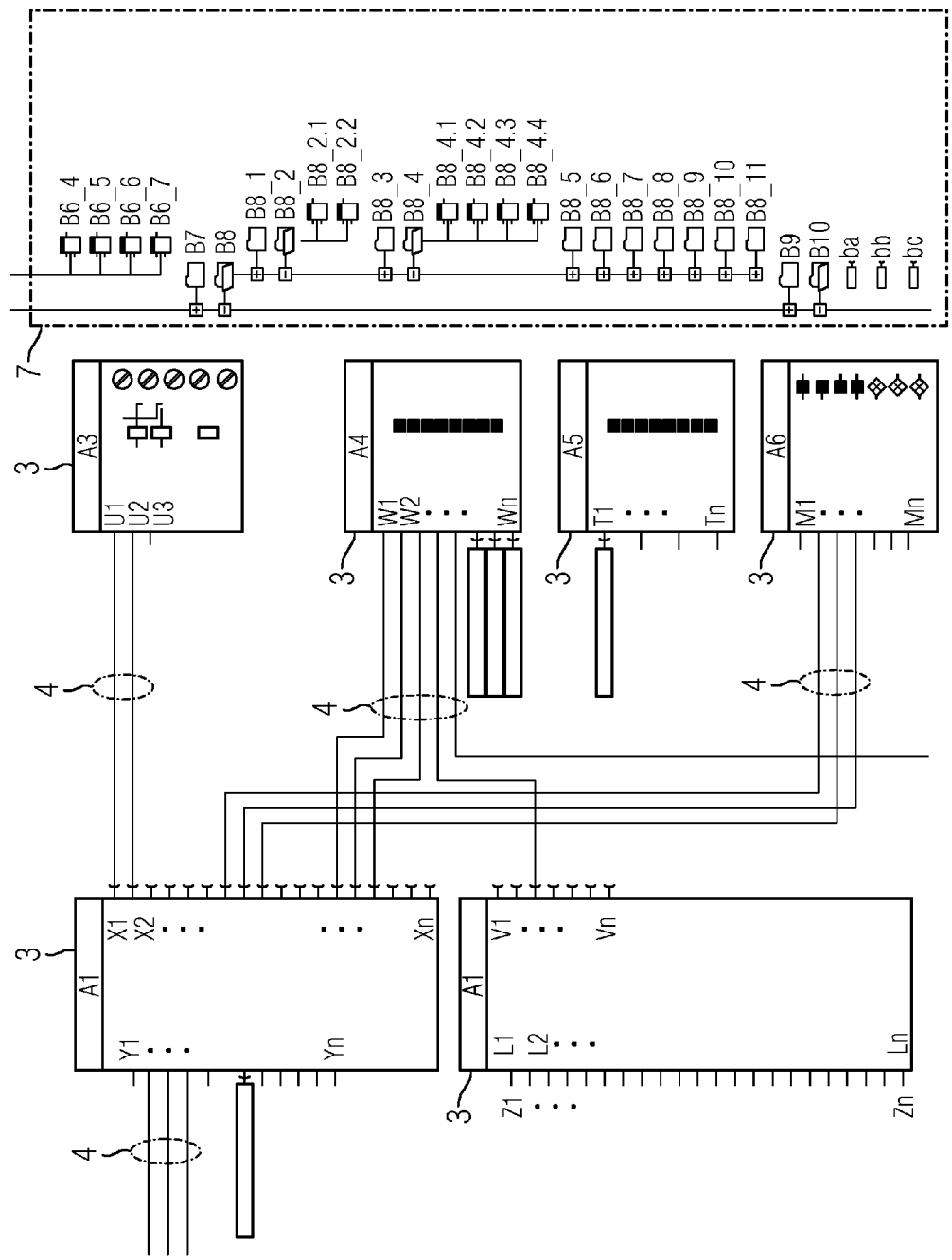
FIG. 1 shows a simplified illustration of a graphical user interface of an engineering system.

By virtue of at least one embodiment of the inventive method, a function plan can be analyzed and ultimately structured in an intelligent manner. As a result of structuring the function plan or the function modules into the corresponding function plan sections in this way, a compact, orderly and clear structuring of the function plan is possible.

The function plan comprises function modules in this context. Individual function modules are connected to at least one other function module via at least one function module connection in this context. However, it is not necessary for all function modules to be connected to each other in this context. Likewise, a function module may have a plurality of function module connections to another function module.

In this context, the function plan section comprises a predefined area for representing function modules and their circuit wiring. A function plan section can therefore represent at least one part of the function plan. The function plan section therefore defines an area that is available for representing/ structuring function modules and their connections. If a function module is connected to a function module of another function plan section, a function module external connection is present. This means that a connection of two function modules exists between the function sections, i.e. a function module external connection. If a function module is connected to a function module within a function plan section, a function module connection is present.

If the function plan exceeds the predefined area of the function plan section, the function plan must be divided into at least two function plan sections. This means that the number and/or the visualization requirements of the function modules (and their connections relative to each other) of a function plan exceed the available area of a function plan section, and therefore the function plan must be divided into a plurality of function plan sections.

In order to ensure that the function plan is structured as clearly as possible over function plan sections, all of the possible scenarios relating to the distribution of the function modules over the available function plan sections are preferably examined and analyzed in respect of their function module external connections. In order that the function plan can be structured as clearly as possible into individual function plan sections, the number of function module external connections should be kept as low as possible. By virtue of such an analysis, an optimal distribution of the function modules to the required function plan sections is possible. During the analysis of the individual scenarios (function plan variants), it is preferably not necessary to examine all of the variants that can be generated. Using intelligent filtering (e.g. number of function module connections of two function modules relative to each other), it is possible to filter out variants that are already unsuitable.

The ultimate assignment of the individual function modules to the function plan sections therefore takes place in accordance with the function plan variant having the smallest possible number of function module external connections. This allows an extremely clear and compact representation of the circuit wiring information of the function modules relative to each other. The function module external connections that are required between two function plan sections due to lack of space are reduced to a minimum.

In an advantageous embodiment of the invention, the assignment of the individual function modules to the function plan sections takes place in accordance with the function plan variant having the smallest number of function module external connections.

In this way, structuring of the function plan can be reduced to the greatest possible extent in terms of reducing the function module external connections that are required.

In a further advantageous embodiment of the invention, a second determination of the number of function plan sections per function plan variant occurs, and only those function plan variants having the smallest number of function plan sections are examined for the purpose of assignment.

During the analysis of the function plan variants, the number of required function plan sections per function plan variant is therefore preferably determined first. After that, only those function plan variants having the smallest number of function plan sections are analyzed in respect of their respective number of function module external connections. The function plan variant having the smallest number of function module external connections is ultimately selected, such that the individual function modules are assigned according to this function plan variant. Using such an analysis, the number of required function plan sections and of required function module external connections can be reduced to a minimum. An extremely compact distribution/structuring of the function plan to the function plan sections is therefore possible.

In a further advantageous embodiment of the invention, a size of the area of the function plan section can be adjusted.

A function plan section represents an area that can preferably be used to print out the function plan. If the function plan exceeds the size of a function plan section, the function plan must be divided into a plurality of function plan sections in order to allow a printout of the function plan. It is advantageous in this context if a size of the available area of the function plan section can be adjusted, preferably by an end user, such that it is ultimately possible to define a space that is available for representing the function plan on a page (function plan section). For example, in the case of a paper printout, the choice of size can be the choice between a DIN A4 or a DIN A3 printout.

Each function plan section preferably has the same size. However, it is equally conceivable for the individual function plan sections to have different sizes, such that e.g. part of the function plan is represented on DIN A4 and another part on DIN A3.

In addition, provision is preferably made for automatically adapting the spatial orientation of the function plan section to that part of the function plan it will represent. The term spatial orientation is understood to mean the choice between portrait format and landscape format in particular. Depending on the function modules that are to be represented, and their connections relative to each other, it can be advantageous for part of the function plan and hence a function plan section to be oriented in landscape or portrait format, for example.

In a further advantageous embodiment of the invention, function modules have different type classes and a third determination of the function modules of the same type class occurs, wherein that function plan variant having function modules of the same type class within the respective function plan section is preferably examined for the purpose of assignment.

For example, function modules can be divided into type classes as follows:
supervisory module,
control module,
operating module,
monitoring module,
regulating modules or modules with processing logic.

The type class to which a function module belongs is preferably stored in the metadata, i.e. in the function catalog of the engineering system. The number of possible type classes is preferably unlimited in this context. This means that during the assignment of the function modules to the function plan sections, those function plan variants having a better distribution of the function modules of the same type class within the respective function plan sections are preferably examined and ultimately also selected. In this context, function modules of the same type class should be assigned to the same function plan section where possible. This improves the structuring of a function plan into individual function plan sections, such that a clearer and more orderly function plan is produced.

In a further advantageous embodiment of the invention, only function modules of the same type class are assigned to a function section.

In a further advantageous embodiment of the invention, function modules can be assigned by an end user to a type class that is preferably definable.

In this way, an end user can define a type class and achieve the desired structuring with the aid of this type class, for example. If the end user assigns a plurality of function modules to this type class, for example, the function modules of this type class are preferably assigned to a function plan section, such that when structuring the function plan into function plan sections, a desired structuring/representation of the function modules on a function plan section is achieved.

It is also conceivable for individual type classes to be combined to form type class groups. In the same way, these type class groups should preferably be assigned to a function plan section, such that an appropriate structuring can be achieved within the function plan.

In a further advantageous embodiment of the invention, a function plan section is represented graphically.

A function plan is ultimately assigned to a plurality of function plan sections. Such a function plan section ultimately comprises function modules with their function module connections and function module external connections. This function plan section is now represented graphically, such that the function plan is graphically visualized on the basis of the individual function plan sections. A function plan section can be represented by way of a printing device, for example. A function plan section corresponds to a printing area of a printed page in this context. A function plan section can therefore be visualized on the paper format that is output by the printing device. It is likewise conceivable for the function plan section to be converted into a corresponding file format (e.g. PDF file format), such that the function plan is graphically visualized on a monitor (a PDF page corresponds to a function plan section).

In a further advantageous embodiment of the invention, the scale of the function plan that is to be represented by the function plan section can be adjusted, preferably by an end user, using art least one input device.

Size and/or orientation of the function plan within the function plan sections can be adjusted using at least one input device, preferably by an end user. If the scale of the function plan is reduced, for example, a larger number of function modules can be represented in a function plan section. If the scale is enlarged, however, the function modules have larger dimensions and ultimately occupy more space on a function plan section. Consequently, fewer function modules can be represented.

In a further advantageous embodiment of the invention, the function plan that is to be represented by the function plan section is scaled in such a way that any information (e.g. font size) to be rendered by the function plan has a size that can be clearly recognized without means of assistance when the function plan is represented by the individual function plan sections.

A size that can be clearly recognized without means of assistance is understood to mean a representational size that allows an end user to read a text or a designation of a device without using any means of assistance (e.g. magnifier).

In a further advantageous embodiment of the invention, it is possible to adjust the scale of the function module that is to be represented by the function plan section.

A change in the scale of the function module results in a change in the size of the function module relative to a function plan section. This means that the size changes relative to the rendering/representation of the function module, e.g. on paper or on a monitor.

In a further advantageous embodiment of the invention, lower and/or upper limits apply to any scaling of the function modules, and the scale is selected within this range such that the fewest possible function plan sections are required for the function plan.

The lower and/or upper limits can preferably be adjusted by an end user. A function plan section ultimately reflects a printing area in the case of output via a printing device. Lower and/or upper limits therefore apply to the scale of the function modules within the printing area, such that the representation of the circuit wiring diagram is not too large or too small. These limit values can be predefined by the system or adjusted by the user. By virtue of the lower/upper limits, the scale of e.g. the printout can be dynamically adapted such that optimal utilization of the printing area or the required function plan sections (pages) can be achieved.

In a further advantageous embodiment of the invention, the function plan variant as specified by the assignment is output by way of an output signal, such that the function plan variant that has been selected by way of the assignment can be represented on the basis of this output signal.

A processing unit outputs the output signal, for example. One such output signal is e.g. a signal to a printing device, which can produce a graphical representation of the function plan on a plurality of pages (function plan sections) by means of this output signal.

In a further advantageous embodiment of the invention, a processing unit performs the determination, assignment and output of the signal, and an output device uses the output signal to represent the function plan variant that has been selected by way of the assignment.

FIG. 1 shows a simplified illustration of a graphical user interface of an engineering system. In this case, a graphical programming interface GUI is provided for the designer. Function modules 3 can be selected using a function catalog 7. The function catalog 7 preferably offers the designer solely those functions that are offered by the respective device (e.g. switching device). Different function modules 3 can therefore be selected and circuit wired to each other by the designer. In order to parameterize the device, the designer merely has to select the function modules 3 from the function catalog 7 and connect the corresponding inputs/outputs of the function modules 3 using the function module connections 4. The graphically represented circuit wiring (function modules 3 and their connections 4) represents the logic or parameterization of one or more devices in the industrial environment. The wiring of a plurality of function modules 3 relative to each other via function module connections 4 ultimately forms a function plan 1. Depending on the device or devices to be represented, it is possible to achieve extremely complex circuit wiring of a plurality of function modules 3 relative to each other, thereby producing an extensive function plan 1.

By way of example, the function catalog 7 can comprise functions/function types as follows: reporting (cyclic, acyclic), standard functions, logic modules, status, faults. These functions can usually be selected via a sorted structure tree (B1, B2, Bn). In this context, subgroups are possible according to function type. For example, the function type logic modules (B8) could comprise the subgroups: truth table 3E/1A, truth table 2E/1A, truth table 5E/2A, counter, timer, signal conversion, zero-voltage-protected element, flashing, flickering, limit value detector, calculators. Subgroups of these in turn may also exist in this context.

The function module 3 (A1, A2, A3, A4, A5, A6) has inputs and/or outputs in this context. In the case of the function module 3 A6, signifying "BB-LED", LEDs are triggered via the inputs M1-Mn, for example, such that M1-M4 signify LED green 1-4 and M5 to M7 signify LED yellow 1-3. The function module 3 A1 signifies "protect/control" in this case and comprises the inputs Y1-Yn (e.g. control instructions on/off, auxiliary control element RM-on/RM-closed/RM-open/DM-closed/DM-open, control functions) and outputs X1-Xn (e.g. 1QE1, 2QE2, 3QE3, 4QE4, 5QE5, QLE-on, QLA-off, QLS-fault, on, off, slide open/closed). The function module 3 A2 signifies "enhanced protection", its inputs L1-Ln (overload protection, asymmetry protection, . . . ) being assigned respective protection parameter values Z1-Zn (e.g. cooling time, pause time, threshold, response, delay). The outputs V1-Vn represent e.g. different protection states (overload, asymmetry, congestion, etc.) in this context. The function module A3 signifies "GG outputs" and has the inputs U1, U2, U3, while A4 signifies "cyclical reporting 0" and has the inputs W1-Wn and A5 signifies "cyclical reporting ⅔" and has the inputs T1-Tn.

Figure 2:
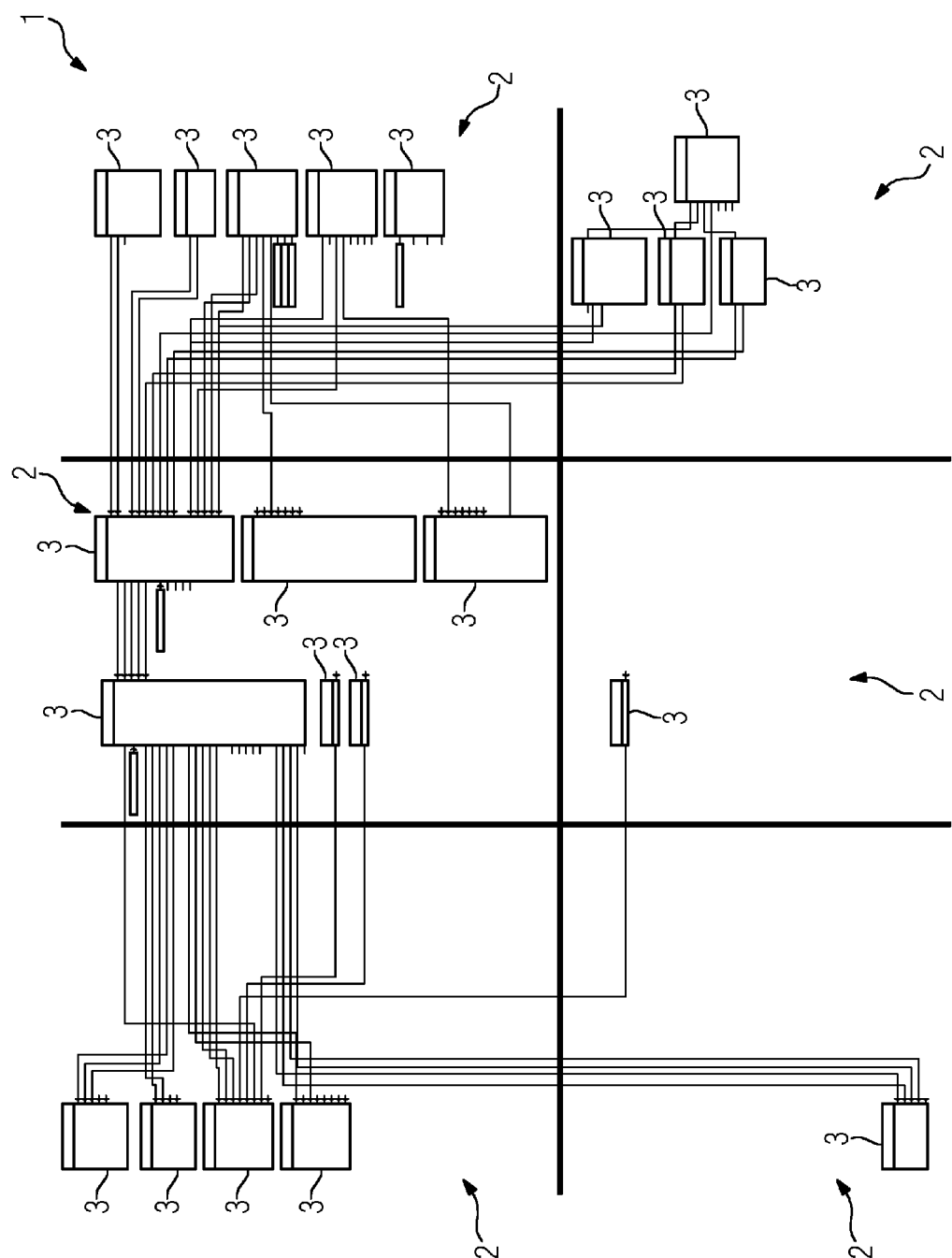
FIG. 2 shows a schematic illustration of a division of a function plan into six function plan sections.

FIG. 2 shows a schematic illustration of a division of a function plan 1 into six function plan sections 2 (printed pages). It is clear in this context that the function modules 3 that are represented with their function module connections are assigned to a corresponding function plan section 2 according to their arrangement in the engineering system and are ultimately printed out on the corresponding page. In this context, a function plan section 2 reflects a printing area of a printed page. This page can be printed onto a DIN A4 page, for example, using a conventional printing device, for example. It is clear that the function modules 3 lie within different function plan sections 2 and hence printed pages. Printing such a function plan ultimately results in six printed pages, on which the function plan 1 is represented. If an end user examines the page that is represented at the bottom in the center, for example, only one function module 3 is represented, whose function module connection projects out of the function plan section 2. If the end user wants to know which function module 3 the function module 3 represented on this page is connected to, the end user has to refer to the bottom left and top left pages. Analysis of a function plan 1 represented in this way is extremely unclear and therefore resource-intensive.

One disadvantage of extracting a function plan 1 using a conventional engineering system is that large function plans 1 are greatly reduced in most cases and therefore very difficult to read. If a clearer illustration is desired, the end user must select individual function modules 3 and specify during the extraction process that only the selected function modules 3 are to be printed. The disadvantage of such an extraction process is the absence of a complete function plan printout, resulting in incomplete documentation of the function plan 1.

Figure 3:
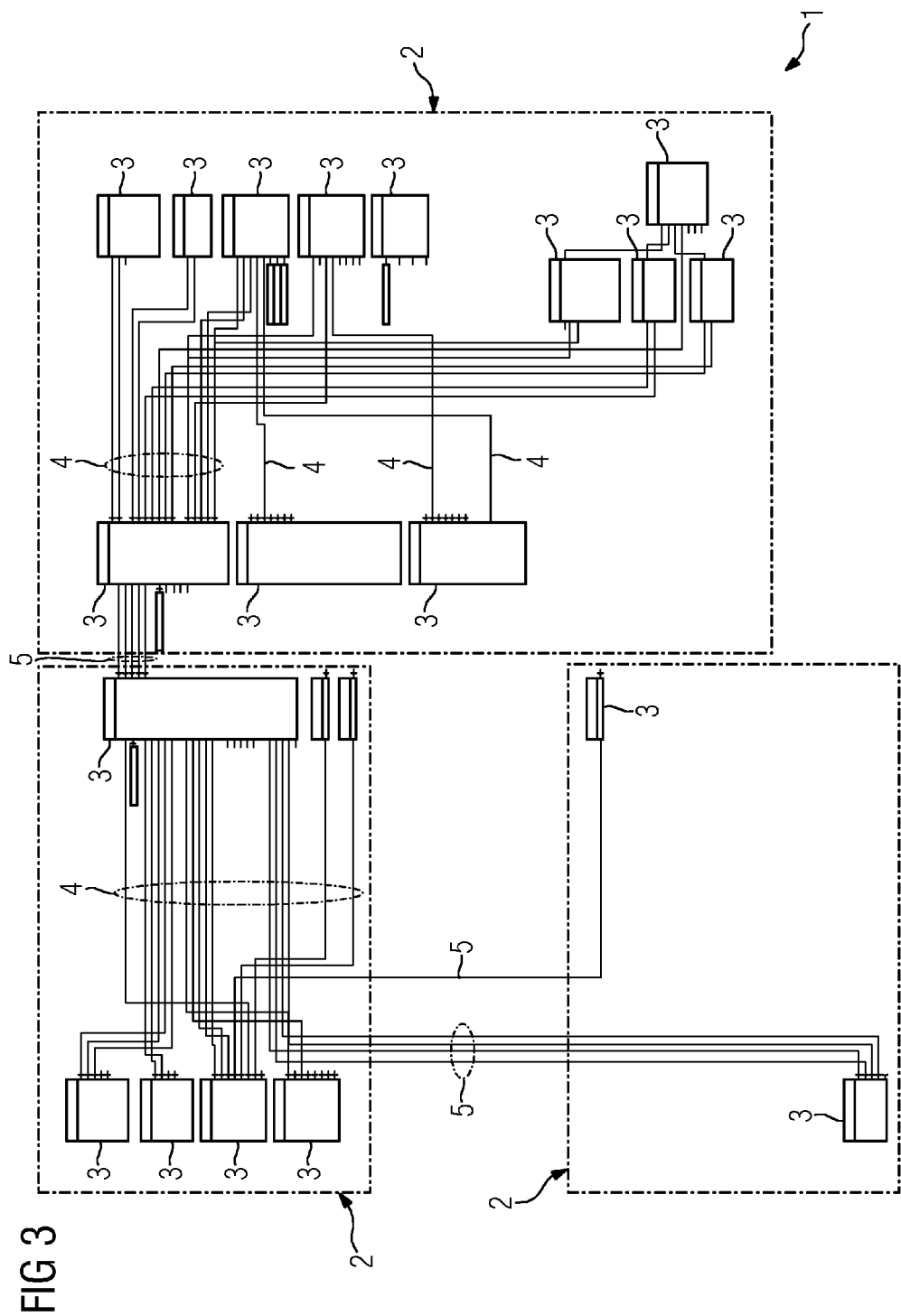
FIG. 3 shows a schematic illustration of a structured function plan in function plan sections.

FIG. 3 shows a schematic illustration of a structured function plan 1 in function plan sections 2. The same function plan 1 is rendered in this context as was visualized by FIG. 2. With regard to its function plan sections 2, this function plan 1 is structured such that it requires only three function plan sections 2 (pages) in order to render the individual function modules 3 and their function module connections 4, 5. In this context, the function plan sections 2 contain function modules 3 that are connected to each other by function module connections 4. If a function module 3 is connected to a function module 3 of another function plan section 2, this is called a function module external connection 5. In order to achieve the clearest possible structuring of the function plan 1, the function plan is not cut into parts of equal size for printing as before, but is intelligently structured in a dynamic manner (i.e. into function plan sections of different size and orientation). The function plan 1 and its function modules 3 are assigned to the function plan sections 2 in such a way that the smallest possible number of function module external connections 5 is required.

As shown in FIG. 3, the number of function plan sections 2 (printed pages) is halved in comparison with conventional methods (FIG. 2), without losing any information from the function plan 1. The advantage of structuring a function plan 1 in this way is that the definition of the function plan sections 2 and hence printing areas per page takes place in such a way that the overall circuit wiring information is structured in a compact manner on the fewest possible pages, while analysis of the function plan is nonetheless simplified by virtue of the individual function plan sections 2 (printed pages). As a result of reducing the function module external connections 5, it is not ultimately necessary for an end user to leaf constantly between a plurality of function plan sections 2 (printed pages) when tracing a function module connection 4 of a function module 3. The readability of a function plan 1 therefore increases considerably.

Individual function module connections 4 are also highlighted in FIG. 3. A function module connection is a connection between two function modules 3.

When structuring the function plan 1 into individual function plan sections 2, the following rules are preferably applied:

The individual function plan sections 2 (printing areas) can have different sizes. However, the function modules 3 that are represented by a function plan section 2 (printing area) have identical dimensions, such that when extracting onto paper, for example, a function module 3 on DIN A3 has the same size as a function module 3 of the function plan 1 on DIN A4.

A function plan section 2 (printing area) can be oriented in either landscape format or profile format.

A function plan section 2 (printing area) is assigned to precisely one page.

In the context of printing, each function plan section 2 is automatically so scaled that it fills the space on a page.

Lower and upper limits apply to the scaling of the function plan 1 within the function plan sections 2, in order to prevent the circuit wiring diagram (the function modules 3 and their connections 4, 5) from becoming too large or too small. These limit values can be predefined by the system or adjusted by the user.

Provision is advantageously made to allow the output of an overview illustration of the function plan 1, representing on a single page the individual function plan sections 2 (printing areas) and their connections relative to each other (function module external connections 5). This makes it easier for a user to assign the individual printed pages to the function plan 1.

In order to allow improved structuring of a function plan 1, it is desirable for individual printing areas (function plan sections 2) to have the smallest possible number of function module external connections 5. Each function module external connection 5 between function modules 3, which extends beyond page boundaries and is therefore interrupted, adversely affects the readability of a printout of the function plan 1. As a result of the inventive method searching for "circuit wiring islands" or partial networks that preferably only have function module connections 4 between the individual function modules 3 of the relevant partial network and have the fewest possible function module connections 4 to other partial networks, a function plan 1 can be so structured that it can be represented using the fewest possible function module external connections 5.

The structuring of a function plan 1 can take place as described in the following example. Starting with one function module 3, n function modules 3 are assembled to form a virtual group in each case. At each step, the group is expanded by a further function module 3 from the surroundings. After each addition of a new function module 3, the temporary function module group is analyzed with regard to the number of function module external connections 5. Not all connections (function module connections 4) of the function plan 1 are examined and analyzed for this purpose:

Connections between function modules 3 that are not in the group are not relevant.

Connections between function modules 3 that are both in the group are "internal connections" and are likewise not examined.

All other connections are function module external connections 5 (connections that leave the partial network or the group). The number of these function module external connections 5 is noted.

A temporary group (function module group) is then extended according to the method described above until the partial network is so large that it extends beyond the maximal scale of a function plan section 2 or of the function plan 1 (i.e. until it would have to be reduced to an unacceptable degree during printing). The function module group having the smallest number of function module external connections 5 forms a function plan section 2 (printing area). If a plurality of function module groups have the same number of function module external connections 5, that group having the better scaling factor (e.g. average of largest and smallest scaling factor) is selected.

The method is repeated until all function modules 3 of the function plan 1 are included. As part of the assignment of the function modules 3 to the function plan sections 2, care is taken to ensure that the fewest possible function plan sections 2 (printing areas) are created. This makes it possible to minimize the number of pages. For example, a printing area is enlarged to a certain extent (meaning that a somewhat "worse" scaling factor is accepted) if this results in the inclusion of function modules which are situated in the peripheral area and for which separate function plan sections would otherwise be required.

Figure 4:
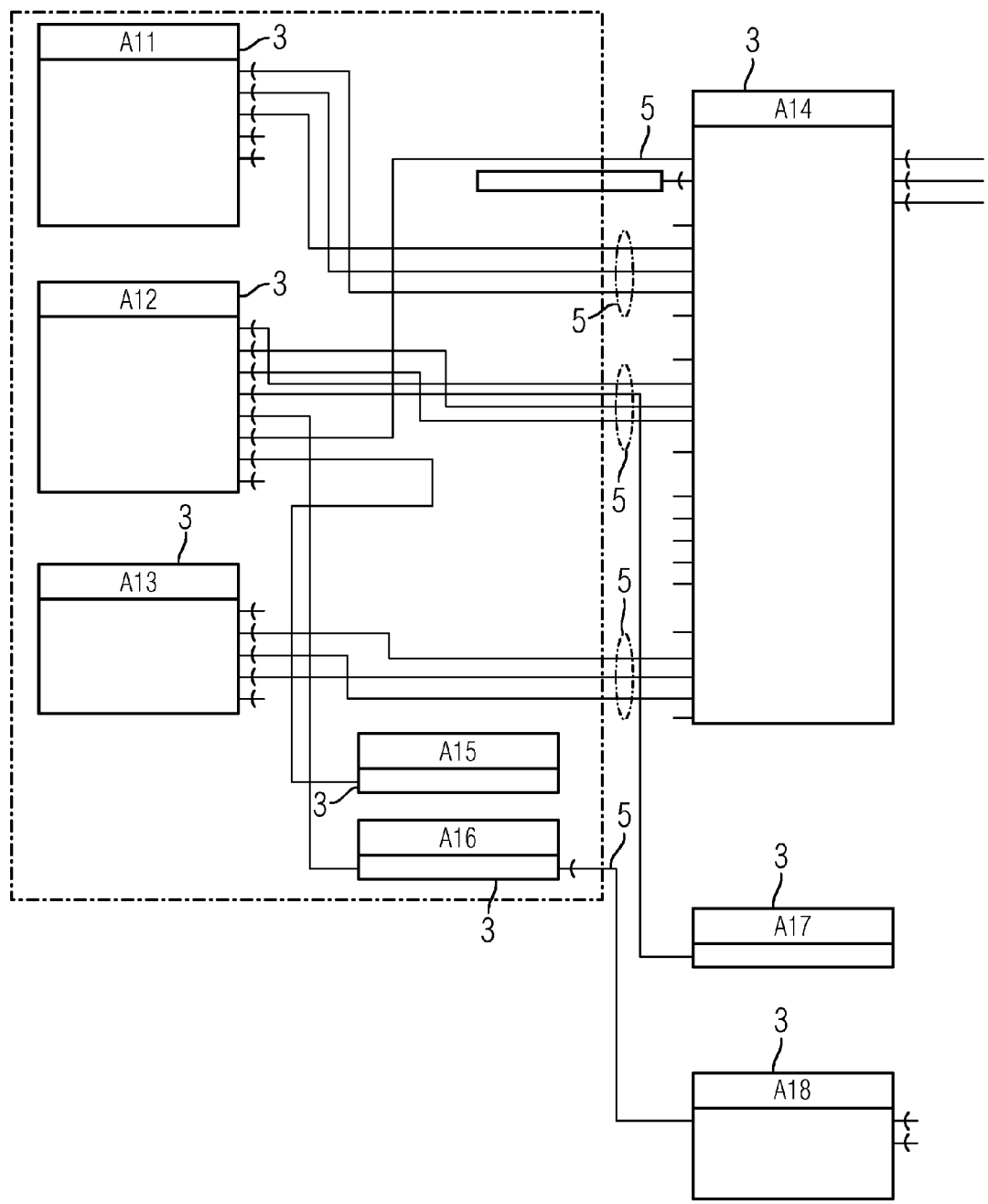
FIG. 4 shows a first function plan variant with its assignment of the function modules to the function plan section.
Figure 5:
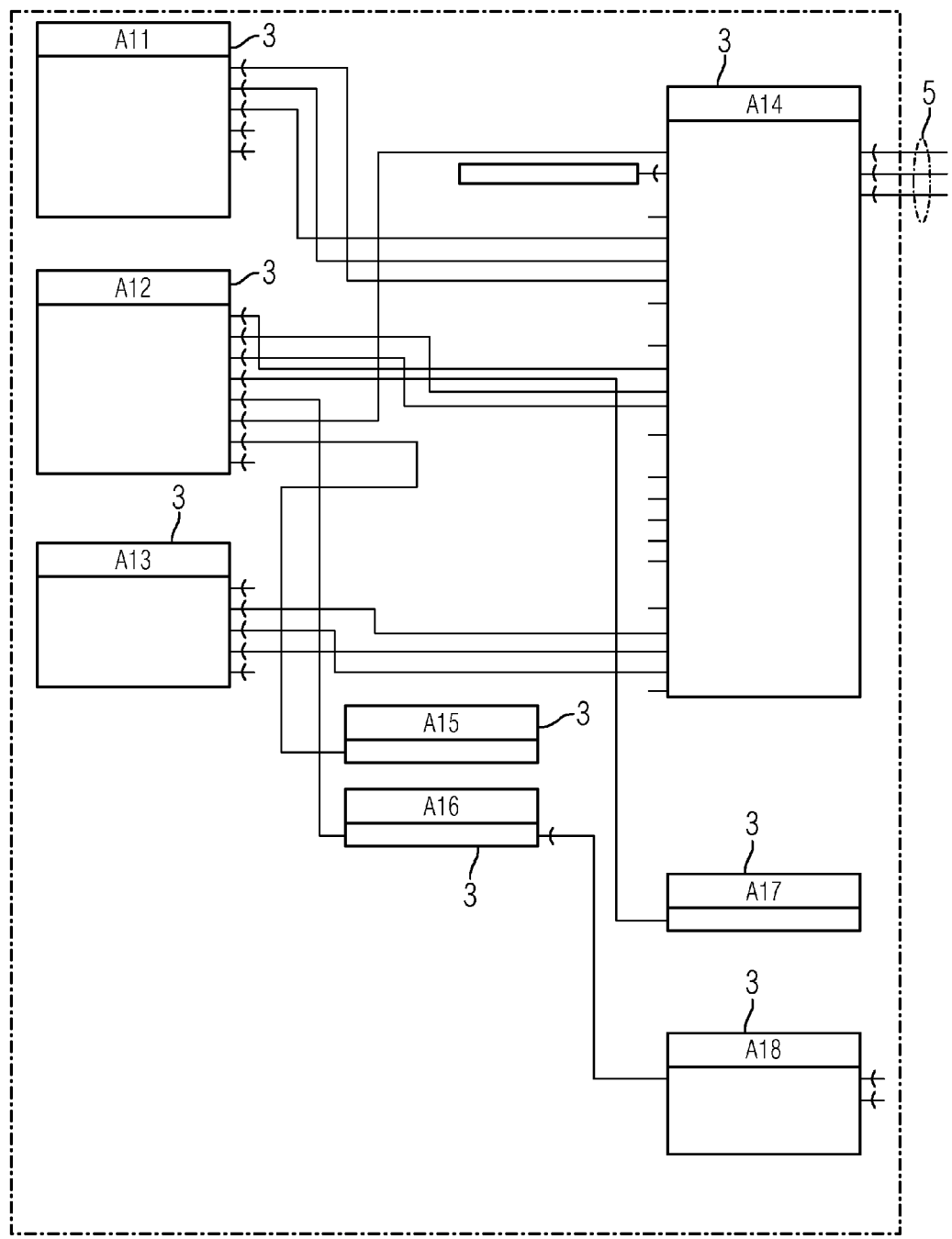
FIG. 5 shows a second function plan variant with its assignment of the function modules to the function plan section.

FIG. 4 and FIG. 5 show two function plan variants and their different assignment of the function modules 3 to the function plan section 2. It can be seen in this context that the function plan section 2 as per FIG. 4 has more function module external connections 5 than the function plan section 2 as per FIG. 5. As a result of including three additional function modules 3 in the function plan section 2 as per FIG. 5, the function module external connections 5 are reduced to three function module external connections 5. By comparison, the function plan variant according to FIG. 4 has twelve function module external connections 5. Using the method according to an embodiment of the invention, preference would therefore be given to the function plan variant as per FIG. 5.

Functional considerations can also be taken into account when structuring the function plan 1. In this context, all of the function modules 3 that are circuit wired in a function plan 1 are first analyzed and assigned to specific functional type classes. For example, type classes may include:

supervisory module,
control module,
operating module,
monitoring module,
regulating modules or modules with processing logic.

The type class to which a function module belongs is stored in the metadata, for example, i.e. in the function catalog of the engineering system. The number of possible type classes is preferably unlimited in this context.

When assigning the function modules 3 to the individual function plan sections 2, provision is preferably made for grouping together the function modules 3 of the same type class. The following conditions are preferably satisfied in this context:

Function modules 3 of one type class are not assigned to more than one function plan section 2.

A function plan section 2 only contains function modules 3 of one type class.

It is likewise conceivable for an end user to perform a manual definition of function modules 3 to a type class. In this way, an end user can identify function modules 3 such that they are preferably represented on a function plan section 2 and hence on a printed page.

Figure 6:
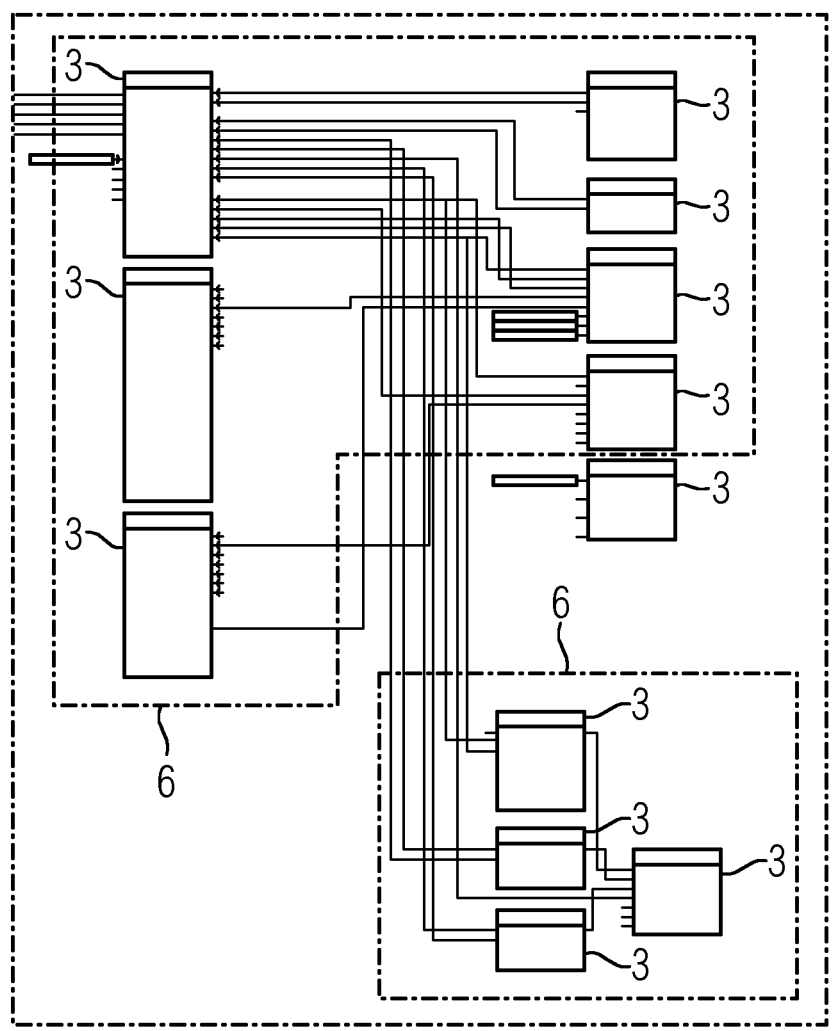
FIG. 6 shows a schematic representation of a function plan section containing function modules of different type classes.

FIG. 6 shows a schematic representation of a function plan section 2 containing function modules 3 of different type classes 6. In this context, the function plan section 2 (which ultimately reflects a printed page) has seven function modules 3 of a first type class 6, four function modules 3 of a second type class 6, and one function module 3 that is not assigned to a type class 6. As a result of function modules 3 being assigned to a shared type class 6, they are preferably structured within a function plan section 2.

It is preferably also possible for an end user to assign type classes 6 to a type class group, such that their function modules 3 can preferably be represented within a function plan section 2.

The invention claimed is:

1. A computer-implemented method for structuring a function plan into function plan sections and for outputting the function plan to an output device so that the function plan is represented, wherein the function plan includes function modules and wherein individual function modules are connectable to at least one other function module via at least one function module connection, wherein a respective function plan section forms a predefined area for representing at least one part of the function plan, and wherein the function module connection between two function modules of different function sections of the function plan is a function module external connection, the method comprising:

determining a number of function module external connections in an assignment of the individual function modules to the individual function plan sections if the function plan exceeds the predefined area of the function plan section, for each function plan variant; to the output device assigning the individual function modules to the function plan sections according to the function plan variant having a minimal number of function module external connections; and outputting the assignments according to the function plan variant.

2. The method of claim 1, wherein the assignment of the individual function modules to the function plan sections takes place in accordance with the function plan variant having the relatively smallest number of function module external connections.

3. The method of claim 2, wherein a second determination of a number of function plan sections per function plan variant occurs, and wherein only the function plan variants having a minimal number of function plan sections are examined for the purpose of assignment.

4. The method of claim 2, wherein a size of the area of the function plan section is adjustable.

5. The method of claim 2, wherein function modules have different type classes, wherein a third determination of the function modules of the same type class occurs, and wherein function plan variant having function modules of the same type class within the respective function plan section is examined for the purpose of assignment.

6. The method of claim 1, wherein a second determination of a number of function plan sections per function plan variant occurs, and wherein only the function plan variants having the minimal number of function plan sections are examined for the purpose of assignment.

7. The method of claim 1, wherein a size of the area of the function plan section is adjustable.

8. The method of claim 1, wherein function modules have different type classes, wherein a third determination of the function modules of the same type class occurs, and wherein function plan variant having function modules of the same type class within the respective function plan section is examined for the purpose of assignment.

9. The method of claim 8, wherein only function modules of the same type class are assigned to a function plan section.

10. The method of claim 1, wherein function modules are assignable by an end user to a type class that is definable.

11. The method of claim 1, wherein a function plan section is represented graphically.

12. The method of claim 1, wherein a scale of the function plan that is to be represented by the function plan section is adjustable using an input device.

13. The method of claim 1, wherein the function plan that is to be represented by the function plan section is scaled in such a way that any information to be rendered by the function plan has a size that is recognizable when the function plan is represented by the individual function plan sections.

14. The method of claim 1, wherein the scale of the function module that is to be represented by the function plan section is adjustable.

15. The method of claim 1, wherein at least one of lower and upper limits apply to any scaling of the function modules, and wherein the scale is selected within this range such that the fewest possible function plan sections are required for the function plan.

16. The method of claim 1, wherein the function plan variant as specified by the assignment is output by way of an output signal, such that the function plan variant that has been selected by way of the assignment is displayed on the basis of the output signal.

17. The method of claim 16, wherein a processing unit performs the determination, assignment and output of the signal, and wherein an output device uses the output signal to represent the function plan variant that has been selected by way of the assignment.

18. A computer program product embodied on a non-transitory computer-readable medium containing program code segments for executing the method of claim 1 when said computer program product is executed on a data processing system.

19. A non-transitory computer readable medium for, when run on a computer device, executing the method of claim 1.

20. An engineering system, configured to output a function plan to an output device, wherein the function plan includes function modules and wherein individual function modules are connectable to at least one other function module via at least one function module connection, wherein a respective function plan section forms a predefined area for representing at least one part of the function plan, and wherein the function plan module connection between two function modules of different function sections of the function plan is a function module external connection, the engineering system configured to:

determine a number of potential module external connections in an assignment of the individual function modules to the individual function plan sections if the function plan exceeds the predefined area of the function plan section, for each function plan variant; to the output device assign the individual function modules to the function plan sections according to the function plan variant having a least possible number of function module external connections; and display the assignments.

* * * * *